United States Patent [19]

Sangyoji et al.

[11] Patent Number: 5,035,965
[45] Date of Patent: Jul. 30, 1991

[54] PRINTED CIRCUIT BOARD HAVING A THIN FILM CELL INCORPORATED THEREIN

[75] Inventors: Kazuo Sangyoji; Morimasa Mano; Takeshi Miyabayashi, all of Nagoya, Japan

[73] Assignee: Brother Kogyo Kabushiki Kaisha, Nagoya, Japan

[21] Appl. No.: 514,684

[22] Filed: Apr. 19, 1990

[30] Foreign Application Priority Data

May 1, 1989 [JP] Japan .................................. 1-112641

[51] Int. Cl.⁵ ............................................. H01M 6/40
[52] U.S. Cl. ........................................ 429/124; 429/192
[58] Field of Search ................ 429/124, 127, 191, 30, 429/192; 361/397, 398, 400, 402, 404

[56] References Cited

U.S. PATENT DOCUMENTS 4,645,943 2/1987 Smith, Jr. et al. ............... 429/124 X
4,730,383 3/1988 Balkanski ............................ 29/623.5
4,985,294 1/1991 Watanabe et al. ...................... 361/397

Primary Examiner—Anthony Skapars
Attorney, Agent, or Firm—Oliff & Berridge

[57] ABSTRACT

Disclosed herein is a thin film cell in which a cell unit is sealed by a polyamide film. Such a cell unit can be obtained by forming an ion-conductive polymer electrolytic layer formed by mixing polyethylene oxide derivatives with lithium salt on a negative-polarity material composed of lithium or a lithiumaluminum metal foil and then forming a layer of a positive-polarity material from composite materials formed by mixing Vanadium oxide and polyethylene oxide derivatives together, on the electrolytic layer, by using a screen printing process. Also disclosed is a printed circuit board with a thin film cell incorporated therein, in which said cell unit is to be mounted on a flexible film substrate, by using a screen printing process. By this invention, the thin film cell and the printed circuit board can be fabricated in a continuous manner by making use of a screen printing process.

5 Claims, 4 Drawing Sheets

PRINTED CIRCUIT BOARD HAVING A THIN FILM CELL INCORPORATED THEREIN

BACKGROUND OF THE INVENTION

1. Field of the Invention

The present invention relates to a thin film cell and a printed circuit board having the thin film cell incorporated therein and a method of fabricating the thin film cell and printed circuit board.

2. Description of the Related Art

An Mn dry cell and an Ni-Cd cell have conventionally been known as cells suitable for portable use. Each of these cells is composed of a positive electrode, a separator, an electrolyte, a negative electrode and a packaging material. By way of example, the method of fabricating an Ni-Cd cell will hereinafter be described. A nickel oxide and a cadmium compound are formed on separate nickel-made punched plate substrates. The thus-formed substrates are used as negative and positive electrodes respectively. Caustic potashes as an electrolytic material are implanted in a spacer made of a porous plastic which is held between both electrodes.

Thus, a nickel-made punched plate having strong rigidity is used as an electrode substrate and caustic potash solution is employed as an electrolyte in the conventional Ni-Cd cell. The following problems arise when trying to make thin flexible Ni-Cd cells or Mn dry cells.

(1) Inferiority in flexibility;
(2) Failure to make thin enough;
(3) Upon deformation of spacer, the spacer breaks and causes a short circuit;
(4) There is a potential leakage of liquid; and
(5) It is difficult to fabricate a cell having electrode patterns in a desired or large variety of shapes.

Therefore, rigid-type shapes such as cylinder-type, button-type, coin-type and box-type shapes have principally been employed in the conventional cells. Thus, it has been considered not only difficult to realize thin and flexible cells but also to realize a design of cells in a variety of shapes.

It has also been considered difficult to mount a thin film cell on a printed circuit board (PCB) for the above-reasons.

The present invention has been completed with a view toward solving the foregoing problems.

SUMMARY OF THE INVENTION

It is a first object of the present invention to provide a method which permits a continuous fabrication of thin and flexible cells of desired shapes by disposing an electrically-conductive polymer electrolyte and a positive-polarity material or the like on a surface of a sheet made of a negative-polarity material to form a desired pattern by using a screen printing process.

It is a second object of the present invention to provide a method for the fabrication of a printed circuit board on which thin film cells of desired shapes are mounted by directly forming thin film cells and wiring circuits on a non-wiring printed circuit board by using a screen printing process.

In one aspect of this invention, there is thus provided a method for the fabrication of a thin film cell which is formed by disposing an electrolytic material on a surface of a sheet made of a negative-polarity material, disposing a positive-polarity material on the electrolytic material and also disposing an electric collector on the positive-polarity material, comprising the step of:

forming at least one of the negative-polarity material, the electrolytic material and the positive-polarity material by using a screen printing process.

In another aspect of this invention, there is provided a method for the fabrication of a printed circuit board with a thin film cell incorporated therein, comprising the steps of:

forming a negative electrode on a substrate;
forming lead terminals and wiring circuits which are to be connected to the negative electrode on the substrate; and
forming an electrically-conductive polymer electrolyte, a positive electrode an an electric collector on the negative electrode successively;
wherein at least one of the negative electrode, the electrolyte, the positive electrode and the collector, and the wiring circuits are formed by using a screen printing process.

The above first-mentioned fabrication method permits the fabrication of thin and flexible cells of desired shapes in a continuous line. The above second-mentioned fabrication method also permits the fabrication of the printed circuit board with the thin film cells of desired shapes, which are to be incorporated therein.

BRIEF DESCRIPTION OF THE DRAWINGS

The above and other objects, features and advantages of the invention will become more apparent from reading the following description of a preferred embodiment taken in connection with the accompanying drawings in which.

DETAILED DESCRIPTION OF THE PREFERRED EMBODIMENTS

A description will hereinafter be made of one embodiment in which a method according to the present invention is described specifically, with reference to the accompanying drawings.

Figure 2:
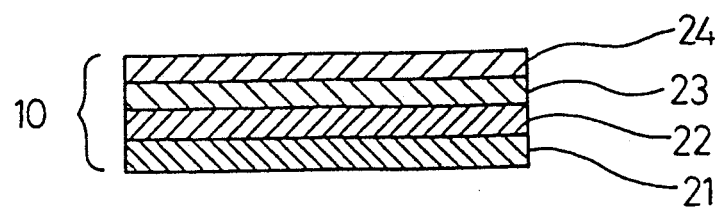
FIG. 2 is a cross-sectional view of a thin film cell.

As shown in FIG. 2, a sheet-like thin film cell 10 which is formed by the method according to the present invention includes a negative-polarity (cathode) material 21 disposed as the lowest layer, an electrolytic material 22 disposed on the negative-polarity material 21, a positive-polarity (anode) material 23 disposed on the electrolytic material 22 and an electric collector 24 placed on the positive-polarity material 23. The negative-polarity material 21 is composed of, for example, lithium (Li) or a metal foil made of a lithium aluminum alloy (Li-Al). The electrolytic material 22 is composed of, for example, a solid-like polyelectrolyte. The positive-polarity material 23 is made up of, for example, composite materials (which are obtained by synthesizing resin and powder made of inorganic materials) such as Vanadium oxide ($V_6O_{13}$). The electric collector 24 consists of, for example, a nickel (Ni)-made metal foil.

Figure 1:
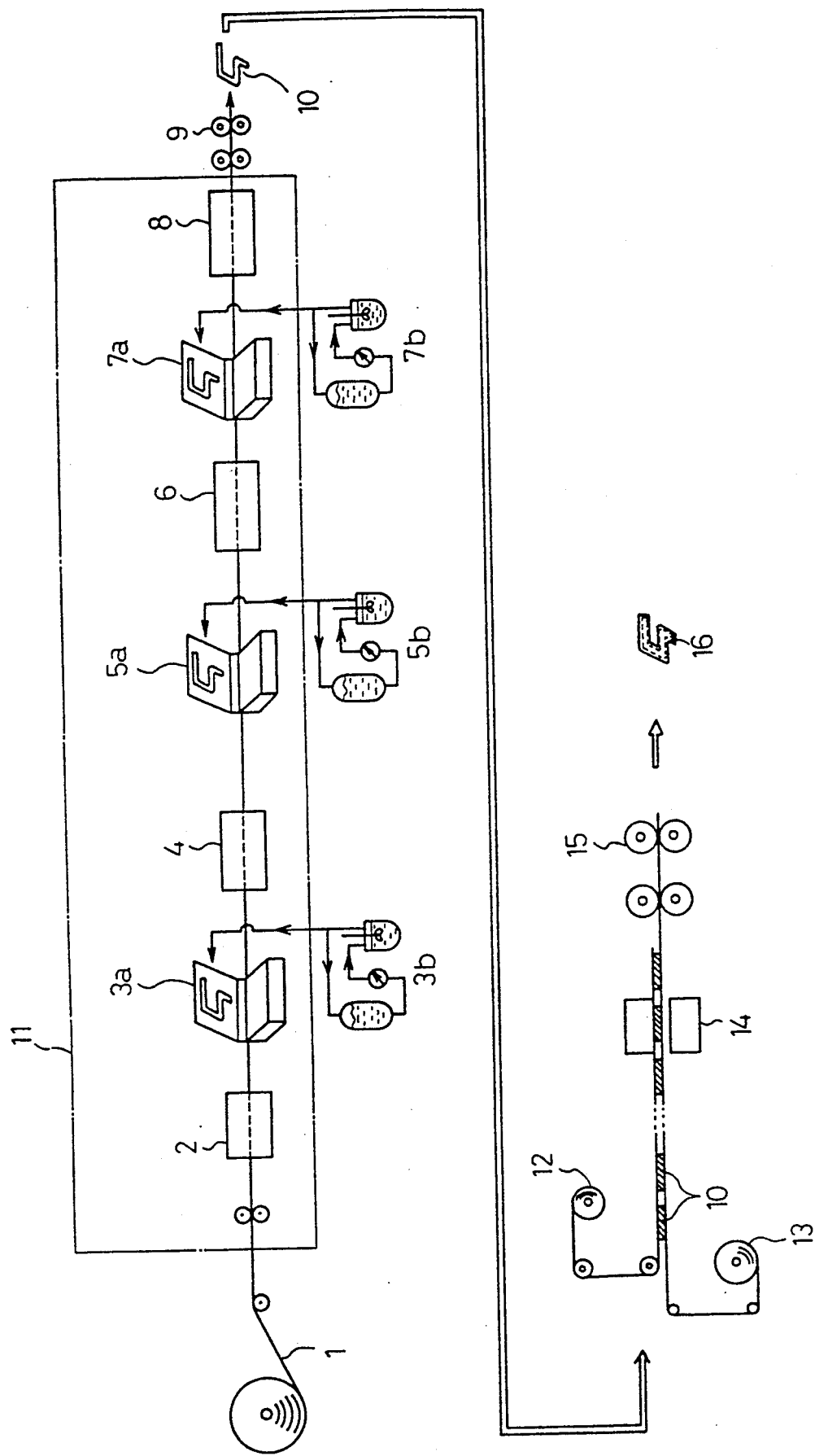
FIG. 1 schematically illustrates various steps in a method of fabricating a thin film cell according to one embodiment of this invention.

A method of fabricating a thin film cell will hereinafter be described with reference to FIG. 1. A commercially available Li-Al metal foil, which has been wound in a roll form, is delivered to the inside of a clean room 11 (the degree of cleanness may preferably be about 100) by a conveyor-line system, followed by subjecting the same to ultrasonic cleaning under the presence of an organic solvent such as kerosene and the metal foil is then cleaned by a brush detergent action or the like, in a cleaning apparatus 2. An ion electrically-conductive polymer electrolyte obtained by mixing, for example, polyethylene oxide derivatives with lithium (Li) salt in a conductive-polymer polymerization apparatus 3b is automatically supplied on a plate with a desired pattern formed thereon in a screen printing apparatus 3a and the electrolytes are then applied on the metal foil 1. This portion of the metal foil is next dried by an ultraviolet (UV) calcining oven 4.

The above-described screen printing apparatus 3a may preferably have meshes of about #200 to #500, a squeegee speed of 10–30 mm/sec., squeegee angle of 10°–20°, squeegee hardness of 60°–80°, printing pressure of 1.0–2.0 kg/cm$^2$ and clearance between each mesh and a printed matter of about 3.0 mm. In addition, the viscosity of the polymer to be used in the screen printing apparatus 3a is set at about 30,000 CPS. The condition of calcining of the metal foil at the oven 4 may preferably be about 100–1,000 mJ/cm$^2$.

A positive-polarity material obtained by mixing Vanadium oxide $V_6O_{13}$ and the aforementioned polyethylene oxide derivatives together, said material optionally having carbon powder added thereto as needed by a positive-polarity material mixing apparatus 5b, is next applied on the above-described polymer electrolyte by a screen printing apparatus 5a which is similar to that described above (3a). The positive-polarity material, which has been applied in desired patterns, enters a calcining oven 6 in the same manner as described above to be hardened therein. The conditions of the screen printing and of the calcining at the oven are the same as that described above.

An electric collector composed of carbon paste, silver paste, copper paste or the like and shield agents or the like, which are mixed by using a collector mixing apparatus 7b, is then applied in desired patterns by making use of another screen printing apparatus 7a. Thereafter, such a product is calcined by a calcining oven 8 in the same manner as described above. The conditions of the printing and calcining are the same as that described above. The thus-obtained patterns are next cut by using a pattern cutting apparatus 9 to form each of the flexible thin-film cell units 10.

Although the described example utilizes a negative-polarity foil and forms the positive-polarity layer by using a screen printing process, it is understood that a positive-polarity foil can alternatively be used in which case the negative-polarity layer is formed by a screen printing process. Additionally, while only the electric collector 7 has been described as being formed from a conductive paste, it is understood that the positive and negative polarity materials as well as the electrolytic material can also be formed from a conductive paste.

Figure 3:
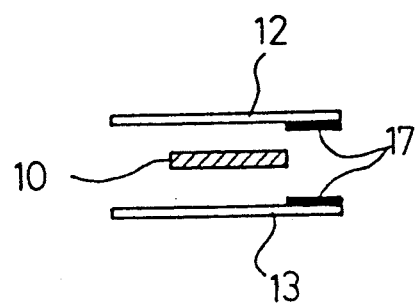
FIG. 3 is an enlarged cross-sectional view showing one of said various steps of FIG. 1.

As shown in FIG. 3, packaging materials 12 and 13 are next brought into a laminated state with the thin-film cell unit 10. Each of packaging materials 12 and 13 are composed of, for example, polyimide and include lead terminals 17 formed of copper, aluminum, etc. Thereafter, the resultant products are each hot-bonded by a hot-bonding apparatus 14 and one end portion of each of the sheet-like cells is then fusion-bonded, while performing a vacuum-draw. The sheet-like cells are cut into a predetermined size by a cut-to-size apparatus 15 to obtain each of the flexible thin-film cells 16.

The above-described steps represent a method for the fabrication of flexible thin-film cells of a single-layer structure. However, in order to produce a multi-layer structure it is only necessary to return the cell unit (which includes the negative-polarity material layer, electrolyte layer and positive-polarity material layer) to the first step, before forming the collector and performing lamination with packaging material, to thermally fusion-bond the Li-Al foil onto the positive-polarity material layer, followed by superposition of each of the layers one on top of another successively in a similar manner as described above. After the desired number of layers are formed, an electric collector is formed on the last formed positive-polarity material layer and the entire cell is laminated by the packaging material.

Figure 4A:
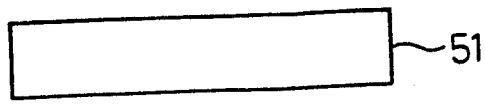
FIGS. 4(a) through 4(e) schematically illustrate various procedures in the fabrication method of a printed circuit board with a thin film cell incorporated therein according to one embodiment of this invention.
Figure 4B:
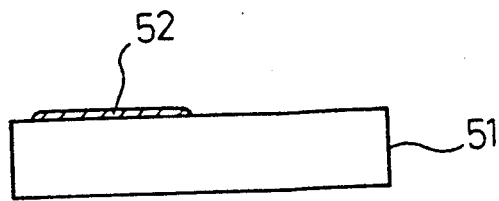
Figure 4C:
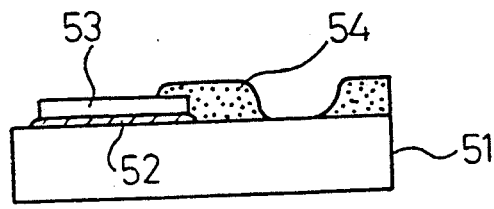
Figure 4D:
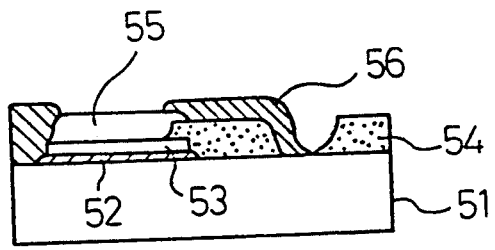
Figure 4E:
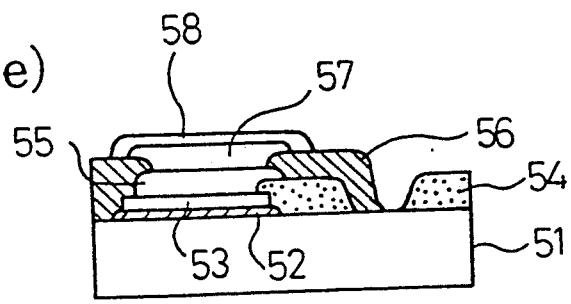

A description will next be made of a method for the fabrication of a printed circuit board with a thin film cell incorporated therein with reference to FIG. 4. Epoxy resin adhesive 52 shown in FIG. 4(b) is applied, at a desired position, on a polyester (Mylar) film 51 depicted in FIG. 4(a) by using the screen printing process. While in an uncured state, a negative-polarity material 53 made up of the Li-Al foil, which has been punched to a desired shape, is disposed on the adhesive 52, to thereby fixedly secure the same thereon. As shown in FIG. 4(c), lead terminals and necessary wiring circuits 54 connected to each of negative electrodes of cells are formed by making use of carbon paste, silver paste, copper paste and any other electrically-conductive paste in accordance with the screen printing process. After they have calcined, an ion-conductive polymer electrolyte 55 obtained by mixing polyethylene oxide derivatives with lithium (Li) salt is applied by the screen printing process in order to form a desired pattern as shown in FIG. 4(d). After calcining of the resultant product, an insulating resist 56 such as polyimide, which is adapted to prevent short-circuiting between a positive-polarity material to be formed subsequently and each of the negative-polarity lead terminals, is formed. As illustrated in FIG. 4(e), a positive-polarity material 57 obtained by mixing Vanadium oxide $V_6O_{13}$ and polyethylene oxide derivatives together, said material optionally having carbon powder added thereto as needed, is next applied on the above-described polymer electrolyte 55 so as to obtain a desired shape in the same manner as described above by using the screen printing process, followed by subjecting of the same to calcining. Next, carbon paste, silver paste, copper paste, etc. is applied on the desired pattern to form an electric collector 58 by using the screen printing process, followed by subjecting of the same to calcining.

Figure 5:
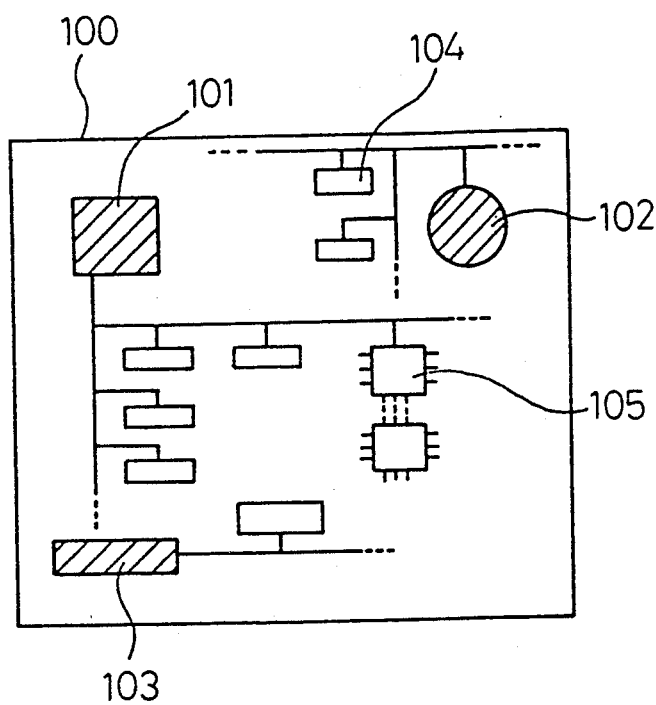
FIG. 5 is a plan view of a printed circuit board.

FIG. 5 shows one example of a printed circuit board with the thin film cells incorporated therein, which has been fabricated in the above-described manner. Mounted on printed circuit board 100 are a 3-V cell 101, a 6-V cell 102, a 12-V cell 103, each fabricated by the above-described method, ICs (Integrated Circuits) 104, mini-flat ICs 105, etc. In order to obtain the cells referred to above, that produce different output power, it is only necessary to increase or decrease the positive and negative polarity materials and the capacity of each of the electrolytic layers, which constitute each of the cells, in the fabrication method shown in FIG. 4.

While the present invention has been described in its preferred embodiment, it is to be understood that the invention is not restricted to the specific embodiment disclosed herein. Various changes, modifications and improvements may be made in the invention which do not affect the spirit of the invention nor exceed the scope thereof as expressed in the appended claims.

What is claimed is:

1. A printed circuit board having a thin film cell incorporated therein, comprising:
    a substrate formed with a predetermined circuit pattern;
    a flexible electrically-conductive negative-polarity material layer fixedly secured on said substrate;
    an electrolytic material layer secured to said negative-polarity material layer;
    a flexible electrically-conductive positive-polarity material layer secured to said electrolytic material;
    an electric collector secured to said positive-polarity material layer; and
    lead terminals electrically connected to said negative-polarity material layer.

2. The printed circuit board according to claim 1, wherein said electrolytic material layer is an ion-conductive polymer electrolyte.

3. The printed circuit board according to claim 1, wherein at least one of said negative-polarity material layer, said positive-polarity material layer, said electrolytic material layer and said electric collector are formed by a screen printing process.

4. The printed circuit board according to claim 3, wherein said predetermined circuit pattern and lead terminals are formed by a screen printing process.

5. The printed circuit board according to claim 1, wherein at least one of said negative-polarity material layer, said positive-polarity material layer, said electrolytic material layer, and said electric collector are formed from a conductive paste.

* * * * *